(12) United States Patent
Huang

(10) Patent No.: US 11,700,740 B2
(45) Date of Patent: Jul. 11, 2023

(54) ORGANIC LIGHT-EMITTING DISPLAY PANEL HAVING WALL-SHAPED ELASTIC CONDUCTOR AND MANUFACTURING METHOD THEREOF

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 173 days.

(21) Appl. No.: 17/091,612

(22) Filed: Nov. 6, 2020

(65) Prior Publication Data

US 2021/0367187 A1 Nov. 25, 2021

(30) Foreign Application Priority Data

May 25, 2020 (CN) .......................... 202010450523.1

(51) Int. Cl.
   *H10K 50/824* (2023.01)
   *H10K 50/856* (2023.01)
   (Continued)

(52) U.S. Cl.
   CPC ......... *H10K 50/824* (2023.02); *H10K 50/856* (2023.02); *H10K 59/12* (2023.02);
   (Continued)

(58) Field of Classification Search
   CPC combination set(s) only.
   See application file for complete search history.

(56) References Cited

U.S. PATENT DOCUMENTS

2014/0346493 A1* 11/2014 Lee ...................... H01L 51/5284
                                                      257/40
2015/0090983 A1* 4/2015 Ozawa ................ H01L 27/3279
                                                      257/40
(Continued)

FOREIGN PATENT DOCUMENTS

CN          101728419        6/2010
CN          103325812        9/2013
            (Continued)

OTHER PUBLICATIONS

Chinese Office Action dated Jan. 29, 22 for corresponding Chinese Patent Application No. 202010450523.1.
(Continued)

*Primary Examiner* — Nduka E Ojeh
(74) *Attorney, Agent, or Firm* — Duane Morris LLP

(57) ABSTRACT

An OLED panel includes a light emitting substrate and a color filter substrate. The light-emitting substrate includes a multi-layer OLED film emitting white light. The color filter substrate includes a color filter array, a conductive layer that is electrically connected to a wall-shaped elastic conductor that is wearing a metal cap. The two substrates are laminated together in a manner that the metal cap is in direct contact with cathode electrode of the OLED at the site of pixel definition layer. The total resistance of the cathode layer of the OLED is therefore reduced significantly, and voltage-drop on cathode and associated image artifacts are minimized.

13 Claims, 10 Drawing Sheets

(51) Int. Cl.
  *H10K 59/12* (2023.01)
  *H10K 59/38* (2023.01)
  *H10K 71/00* (2023.01)
  *H10K 71/60* (2023.01)
  *H10K 71/20* (2023.01)
  *H10K 102/00* (2023.01)

(52) U.S. Cl.
  CPC ............ *H10K 59/38* (2023.02); *H10K 71/00* (2023.02); *H10K 71/231* (2023.02); *H10K 71/60* (2023.02); *H10K 59/1201* (2023.02); *H10K 2102/3026* (2023.02)

(56) References Cited

U.S. PATENT DOCUMENTS

| 2016/0035803 | A1 | 2/2016 | Kim et al. |
| 2019/0067391 | A1 | 2/2019 | Li et al. |
| 2020/0106039 | A1 | 4/2020 | Li et al. |
| 2020/0313113 | A1* | 10/2020 | Zang ................ H01L 51/5228 |
| 2021/0005835 | A1 | 1/2021 | Wang et al. |
| 2021/0367216 | A1* | 11/2021 | Huang ................ H10K 50/156 |
| 2022/0027004 | A1* | 1/2022 | Cao ....................... G06F 3/0412 |

FOREIGN PATENT DOCUMENTS

| CN | 107394052 | 11/2017 |
| CN | 107731877 | 2/2018 |
| CN | 108461527 | 8/2018 |
| CN | 108649060 | 10/2018 |
| CN | 109037481 | 12/2018 |
| CN | 110112188 | 8/2019 |
| JP | 2015103280 | 6/2015 |
| JP | 6281135 | 2/2018 |
| KR | 20150097853 | 8/2015 |
| KR | 20160014311 | 2/2016 |
| KR | 20160030699 | 3/2016 |
| WO | 2019/010965 | 1/2019 |

OTHER PUBLICATIONS

Extended European Search Report dated Sep. 14, 2021 for corresponding European Application No. 21159328.0.
Second Office Action dated Jun. 30, 2022 for Corresponding Chinese Patent Application No. 202010450523.1.
Communication Pursuant to Article 94(3) EPC dated Mar. 15, 2023 for Corresponding European Patent Application No. 21 159 328.0.

* cited by examiner

ORGANIC LIGHT-EMITTING DISPLAY PANEL HAVING WALL-SHAPED ELASTIC CONDUCTOR AND MANUFACTURING METHOD THEREOF

CROSS-REFERENCES TO RELATED APPLICATION

This application claims to the priority of Chinese patent application No. 202010450523.1 filed on May 25, 2020, which is incorporated herein by reference in its entirety.

TECHNICAL FIELD

The present disclosure relates to the field of display technologies and, in particular, to an organic light-emitting display panel and a manufacturing method thereof.

BACKGROUND

In recent years, OLED (OLED hereinafter) panels have gradually become the mainstream of mobile display terminal screens and display screens. An OLED panel includes a plurality of sub-pixels arranged in an array, where each sub-pixel includes a pixel driving circuit and a light-emitting element electrically connected to the pixel driving circuit.

In the related art, each light-emitting element includes multiple layers stacked up in sequence: an anode, a hole transport layer, a light-emitting layer, an electron transport layer and a cathode. In order to achieve high sub-pixel density in a display panel or to manufacture a display panel on a tiny silicon chip, a convenient approach is to continuously deposit the hole transport layer, the light-emitting layer, the electron transport layer and the cathode without pixeled shadow mask. The separation of sub-pixels is realized by a pixel definition layer. Furthermore, to prevent or reduce lateral charge diffusion in the hole transport layer, some unique structures, such as sidewall with inversed slope, are created in the pixel definition layer to disrupt the continuity of the hole transport layer.

The thickness of the cathode film is generally made relatively thin to allow OLED light passing through. Uneven surface topology of the OLED panel is another cause to make the cathode film even thinner at the sidewalls or slopes of the pixel definition layer. Large resistance of cathode film is therefore inevitable with ordinary design. External supplied voltage for OLED bias will be attenuated across the entire OLED panel, which is a "voltage drop" mechanism similar to what is frequently observed along power supply line of OLED. It is therefore a primary objective of this disclosure to provide a solution to overcome the said voltage drop on the cathode film.

SUMMARY

An OLED panel and a manufacturing method thereof are provided in embodiments of the present disclosure to minimize the nonuniformity of light emission caused by the voltage drop on the cathode film.

In a first aspect, an OLED panel is provided in the embodiments of the present disclosure and includes a light-emitting and a color filter substrate disposed in parallel to the light-emitting.

The light-emitting substrate includes: a first substrate, a first electrode layer, a pixel definition layer, a light-emitting layer and a second electrode layer; the first electrode layer includes a plurality of first electrodes and is disposed on the first substrate; the pixel definition layer is disposed on the first electrodes and includes a plurality of first opening structures, to exposes part of the first electrodes; the hole transport layer, light-emitting layer, electron transport layer and the second electrode layer are successively disposed on the exposed first electrodes.

The color filter substrate includes: a second substrate, a conductive layer, a color filter layer, a wall-shaped elastic conductor wearing a metal cap; the conductive layer is disposed on a surface of the second substrate facing towards the light-emitting substrate; the color filter layer is disposed on the same surface and overlapped on the conductive layer; the color filter layer includes a plurality of sub-pixel color filters arranged in an array with a gap between each two adjacent color filters, that a portion of the conductive layer is then exposed through the gap; the elastic conductor is sitting on the conductive layer at the gaps, so as to have a same voltage as the conductive layer; the metal cap is disposed on the top of the elastic conductor facing towards the light-emitting substrate.

By aligning the light-emitting substrate and the color filter substrate in such a manner that a vertical projection of the elastic conductor on the first substrate is overlapped with a vertical projection of the pixel definition layer on the first substrate.

In a second aspect, a manufacturing method of an OLED panel is provided in the embodiments of the present disclosure and includes steps described below.

A first electrode layer, a pixel definition layer, a hole transport layer, a light-emitting layer, an electron transport layer and a second electrode layer are successively formed on a first substrate, where the first electrode layer includes a plurality of isolated first electrodes, the pixel definition layer includes a plurality of first opening structures allowing the hole transport layer to contact to the first electrodes.

A conductive layer and a color filter layer are formed on a second substrate, where the color filter layer includes a plurality of sub-pixel color filters, and a gap between any two adjacent sub-pixel color filters is created to expose the conductive layer in the gap region.

A wall-shaped elastic conductor wearing a metal cap is formed on the second substrate, that the bottom of the elastic conductor is in contact with the conductive layer and the metal cap is in direct contact with the second electrode above the pixel definition layer.

According to the OLED panel provided in the embodiments of the present disclosure, the second electrode layer on the light-emitting substrate is electrically connected, at each subpixel, to the conductive layer on the color filter substrate via the metal cap and then the elastic conductor route. As results, the total resistance of the second electrode, i.e. the cathode of the OLED, is reduced significantly, and the voltage drop on cathode and associated display image artifacts can be minimized to a level below what a human can conceive.

DETAILED DESCRIPTION

Figure 1:
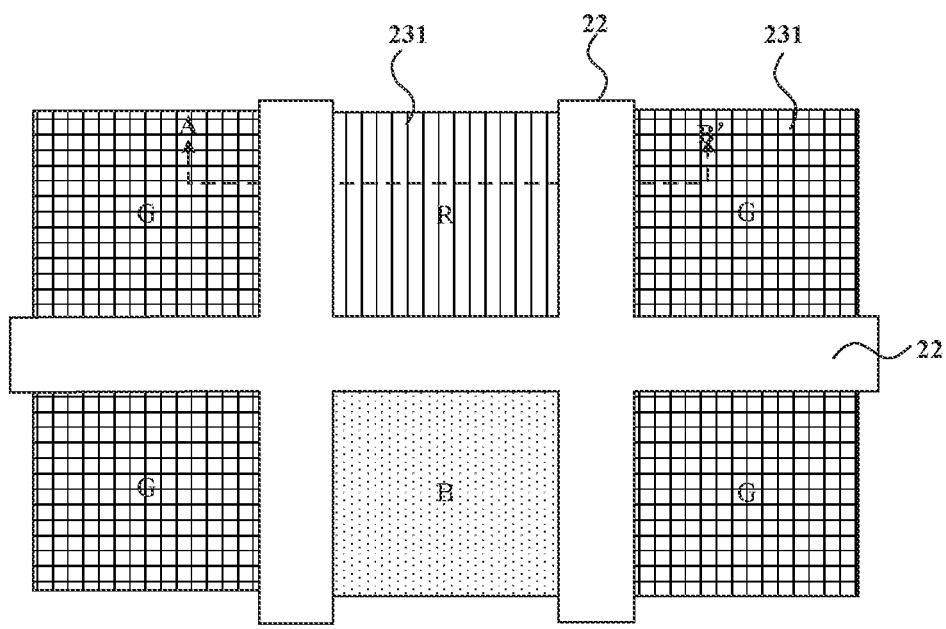
FIG. 1 shows a plane view of an OLED panel according to embodiments of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

Figure 2:
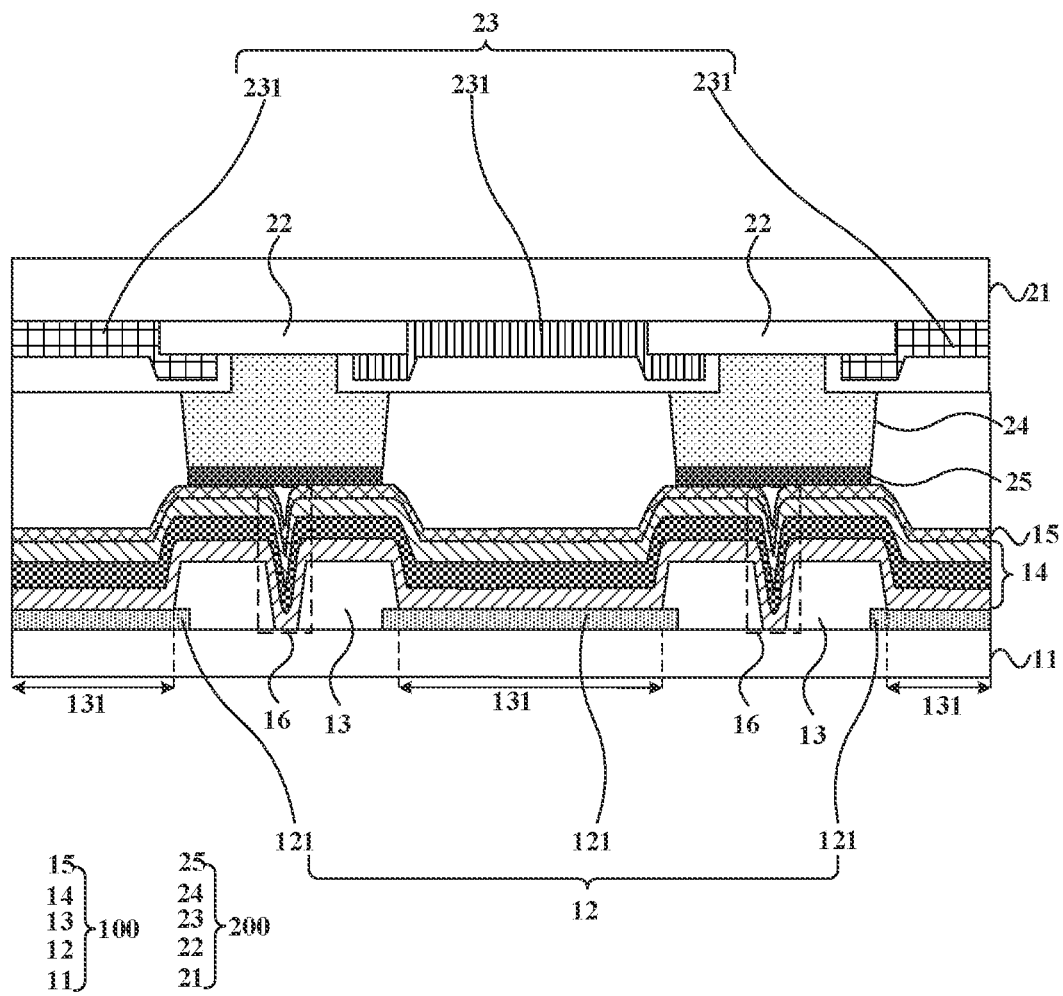
FIG. 2 shows a cross-sectional view of the OLED panel illustrated in FIG. 1 taken along a cross section A-A'.

FIG. 1 depicts a plane view of an OLED panel according to embodiments of the present disclosure, its cross-sectional view is illustrated in FIG. 2 along a cross section A-A'. As shown in FIGS. 1 and 2, the OLED panel includes a light-emitting substrate 100 and a color filter substrate 200 disposed in parallel to the light-emitting substrate.

The light-emitting substrate 100 includes: a first substrate 11, a first electrode layer 12, a pixel definition layer 13, a light-emitting layer 14 and a second electrode layer 15. The first electrode layer 12 includes a plurality of isolated first electrodes 121 and is disposed on the first substrate 11. The pixel definition layer 13 is disposed on the first electrodes 121 and includes a plurality of first opening structures 131 to expose part of the first electrodes 121. The hole transport layer, the light-emitting layer 14 and the second electrode layer 15 are successively disposed on the exposed first electrodes 121.

The color filter substrate 200 includes: a second substrate 21, a conductive layer 22, a color filter layer 23, a wall-shaped elastic conductor 24 wearing a metal cap 25. The conductive layer 22 is disposed on a surface of the second substrate 21 facing towards the light-emitting substrate 100. The color filter layer 23 is disposed on the same surface and overlapped on the conductive layer 22. The color filter layer 23 includes a plurality of sub-pixel color filters 231 arranged in an array with a gap between each two adjacent sub-pixel color filters 231 that a portion of the conductive layer 22 is then exposed through the gap. The elastic conductor 24 is sitting on the conductive layer at the gaps, so as to have a same voltage as the conductive layer 22. The metal cap 25 is disposed on the top of the wall-shaped elastic conductor 24 facing towards the light-emitting substrate 100. The vertical projection of the wall-shaped elastic conductor 24 on the first substrate 11 is overlapped with the vertical projection of the pixel definition layer 13 on the first substrate 11.

In conjunction with FIGS. 1 and 2, the position corresponding to a first opening structure 131 is a sub-pixel region. In this region, the first electrode 121, the light-emitting layer 14 and the second electrode layer 15 form a light-emitting element. The light-emitting layer 14 may include, for example, a film layer such as a hole injection layer, a hole transport layer, a light-emitting layer, an electron transport layer and an electron injection layer. To achieve a high sub-pixel density in a display panel or manufacture a display panel on a tiny silicon chip, the light-emitting layer 14 of the light-emitting element may be provided as an integral film layer, that is, the electron transport layer, the hole transport layer, the light-emitting layer, the electron injection layer and the hole injection layer of all light-emitting elements are not interrupted and each film layer in the light-emitting element cross pixel definition layers 13 between any two adjacent sub-pixels, thus avoiding the use of a plurality of masks to separately evaporate various layers of different light-emitting elements. Further, to prevent or reduce lateral charge diffusion or lateral crosstalk in the hole injection layer or the hole transport layer, a groove structure 16 may also be provided on the pixel definition layer 13 between two adjacent sub-pixels to increase the transmission path of the leakage current in the two adjacent sub-pixel regions in the film layer such as the hole injection layer, thereby blocking the lateral leakage current and further improving the display effect of the display panel.

It is to be noted that whether the groove structure 16 is provided at the pixel definition layer 13 is not limited in the embodiments of the present disclosure. The second electrode layer 15 crossing the pixel definition layer 13 is easy to break when the groove structure 16 is provided in the pixel definition layer 13, so the solution provided by the embodiments of the present disclosure is also applicable to the case where the groove structure 16 is provided in the pixel definition layer 15.

According to the embodiments of the present disclosure, the conductive layer 22, the wall-shaped elastic conductor 24 wearing the metal cap 25 are configured in the color filter substrate 200, and the second electrode layer 15 is electrically connected to the conductive layer 22 through the metal cap 25 and the wall-shaped elastic conductor 24. On one hand, the problem that the resistance of the second electrode layer 15 is too large due to the thinner second electrode layer 15 can be solved. On the other hand, if the second electrode layer 15 is broken at the position of the pixel definition layer 13, since the second electrode layer 15 can also be electrically connected to the conductive layer 22 sequentially through the metal cap 25 and the wall-shaped elastic conductor 24, the voltage drop at the broken position of the second electrode layer 15 can also be avoided. In addition, the wall-shaped elastic conductor 24 has elasticity, and can provide support between the light-emitting substrate and the color filter substrate, absorb mechanical pressure during encapsulation of the light-emitting substrate 100 and the color filter substrate 200, and maintain close contact of film layers in various regions to be maintained after the encapsulation. In addition, the metal cap 25 is deposited and grown on the wall-shaped elastic conductor 24, so the metal cap 25 can be closely connected to the wall-shaped elastic conductor 24 to obtain reliable electrical connection at the atomic or molecular level. In addition, since the second electrode layer 15 is generally made of a metal material or a metal oxide material, the connection between the elastic conductor 24 and the second electrode layer 15 through the metal cap 25 can reduce relatively large contact resistance caused by different chemical and physical properties of the surfaces of the elastic conductor 24 and the second electrode layer 15.

The conductive layer 22 may also extend to the non-display region of the color filter substrate 200 to form a second electrode connection pad so as to be conveniently connected to an external voltage control electrode on the underlying light-emitting substrate 100 during a subsequent bonding process.

According to the OLED panel provided in the embodiments of the present disclosure, the second electrode layer on the light-emitting substrate is electrically connected, at each subpixel, to the conductive layer on the color filter substrate via the metal cap and then the elastic conductor route. As results, the total resistance of the second electrode, i.e. the cathode of the OLED, is reduced significantly, and the voltage drop on cathode and associated display image artifacts can be minimized to a level below what a human can conceive. Since the wall-shaped elastic conductor has resilience, the wall-shaped elastic conductor at each position can also be in close contact with the second electrode layer through the metal cap, avoiding a gap between part of the second electrode layer at the region of the pixel definition layer and the color filter substrate caused by resonant cavity structures of different sub-pixels in the related art. In addition, the metal cap is deposited and grown on the wall-shaped elastic conductor, so the metal cap can be closely connected to the wall-shaped elastic conductor to obtain reliable electrical connection at the atomic or molecular level. Since the second electrode layer is generally made of a metal material or a metal oxide material, the connection between the wall-shaped elastic conductor and the second electrode layer through the metal cap can reduce the problem of relatively large contact resistance caused by different chemical and physical properties of the surfaces of the wall-shaped elastic conductor and the second electrode layer.

In one embodiment, the wall-shaped elastic conductor 24 includes an organic and conductive base material and an organic base material mixed with conductive particles.

The wall-shaped elastic conductor 24 is disposed between two adjacent sub-pixel color filters 231, so that each pixel can be isolated into an independent closed or semi-closed space. An organic material has certain elasticity. The wall-shaped elastic conductor 24 is selected to include the organic and conductive base material, so that the wall-shaped elastic conductor 24 may have vertical elasticity in the direction perpendicular to the second substrate 21, thus ensuring good resilience of the wall-shaped elastic conductor 24. Further, the conductivity of the wall-shaped elastic conductor 24 can be improved by doping conductive ions in the wall-shaped elastic conductor 24.

In one embodiment, the organic and conductive base material includes a poly ethylene material, a polyvinyl chloride material, a polystyrene material, a polypropylene material or a resin material.

In one embodiment, the organic material mixed with conductive particles includes at least one of following materials: a carbon nanoparticle, a carbon nanotube, a graphene particle, a silicon nanoparticle or a metal nanoparticle.

A high proportion of carbon nanoparticles, carbon nanotubes, graphene particles, silicon nanoparticles or metal nanoparticles are directly doped into the organic base material of the wall-shaped elastic conductor 24, so that the conductivity of the wall-shaped elastic conductor 24 is further improved. Moreover, the doped material mixed with conductive particles can also reduce the light transmittance of the wall-shaped elastic conductor 24, thus preventing the problem of light emission crosstalk in two adjacent sub-pixel regions.

In one embodiment, a volume ratio of the carbon nanoparticles or the carbon nanotubes in the wall-shaped elastic conductor 24 ranges from 10% to 30%.

Conductive particles are doped in the wall-shaped elastic conductor 24, so that better conductivity and lower light transmittance of the wall-shaped elastic conductor 24 are realized. Amount of conductive particles mixed in the wall-shaped elastic conductor 24 will modulate the physical properties of the elastic conductor, that excessive amount of conductive particles will result in higher conductivity and less elasticity, while deficiency in conductive particles will lead to better elasticity but lower conductivity. It is found through analysis by the inventor, that a volume ratio of carbon nanoparticles or carbon nanotubes in the wall-shaped elastic conductor 24 ranging from 10% to 30% is preferred, considering a balance among the conductivity, light transmittance, elasticity and manufacturability. For example, 10% to 30% volume ratio of carbon nanoparticles in poly ethylene (PE), results a better conductivity and acceptable elasticity. If carbon nanotubes with better conductivity are adopted, the volume ratio of the doped carbon nanotubes can be reduced 3% to 6%, resulting better conductivity and elasticity of the wall-shaped elastic conductor.

It is to be noted that the organic and conductive base material includes a poly ethylene material, a polyvinyl chloride material, a polystyrene material, a polypropylene material or a resin material, and may be another organic material. The material of the organic and conductive base material is not specifically limited in the embodiments of the present disclosure. The conductive particles mixed in the base material include at least one of following materials: the carbon nanoparticle, the carbon nanotube, the graphene particle, the silicon nanoparticle and the metal nanoparticle, and the mixed conductive particles may be another particles having a conductive property. The property of the material mixed with conductive particles is not specifically limited in the embodiments of the present disclosure. In an actual design process, the balance between the resilience and conductivity of the wall-shaped elastic conductor may be comprehensively weighed, so that an appropriate organic and conductive base material may be selected, and the appropriate material and volume ratio of material mixed with conductive particles can be determined.

In one embodiment, the length of the carbon nanotube is less than 2 um and the diameter of the carbon nanotube is less than 50 nm.

The thickness of the wall-shaped elastic conductor 24 is generally set between 1 micron and 5 microns, so after the volume ratio range of the carbon nanoparticles or carbon nanotubes in the wall-shaped elastic conductor 24 is selected, the length of the carbon nanotube is set to be less than 2 um and the diameter of the carbon nanotube is set to be less than 50 nm, and thereby it is relatively easy to achieve a wall-shaped elastic conductor 24 with a low resistance value while satisfying the thickness of the wall-shaped elastic conductor 24. Therefore, the manufactured wall-shaped elastic conductor 24 has better conductivity and resilience while having smaller resistance, avoiding the impact of too large resistance of the wall-shaped elastic conductor 24 on the electron transmission from the second electrode layer 15 to the wall-shaped elastic conductor 24.

In one embodiment, the wall-shaped elastic conductor 24 includes a conducting macromolecule polymer.

Further, the wall-shaped elastic conductor 24 may be configured to include the conducting macromolecule polymer. The conducting macromolecule polymer is selected as the main material of the wall-shaped elastic conductor 24, so that on one hand, the electrical connection between the conductive layer 22 and the metal cap 25 can be achieved by using the high conductivity of the material itself, and on the other hand, the potential conductive particle contamination existing in the manufacturing process of the wall-shaped elastic conductor 24 by using the etching process due to the doping of conductive particles such as carbon powder in the wall-shaped elastic conductor 24.

In one embodiment, the wall-shaped elastic conductor 24 includes conducting macromolecule polyaniline, polyacetylene or polybutadiene.

The high molecular polymer material with relatively high conductivity, such as polyaniline, polyacetylene or polybutadiene, is adopted. In the molecular structure of the type of polyaniline, polyacetylene or polybutadiene, single bonds and double bonds are alternately arranged between carbon and carbon molecules: —CH=CH—, and π electrons in the double bonds of the carbon molecules are delocalized. The movement of π electrons along a conjugated chain forms the conductive mechanism of the high molecular polymer. The longer the molecular chain of the conjugated polymer, the greater the number of π electrons, the lower the activation energy of the electrons, and the better the conductivity.

In one embodiment, the wall-shaped elastic conductor 24 further includes at least one of the followings: carbon nanoparticle, carbon nanotube, graphene particle, silicon nanoparticle and metal nanoparticle.

When the wall-shaped elastic conductor 24 is made of a conducting macromolecule polymer, the conductivity of the wall-shaped elastic conductor 24 can be further improved by doping particles such as carbon nanoparticles, carbon nanotubes, graphene particles, silicon nanoparticles or metal nanoparticles into the wall-shaped elastic conductor 24.

Figure 3:
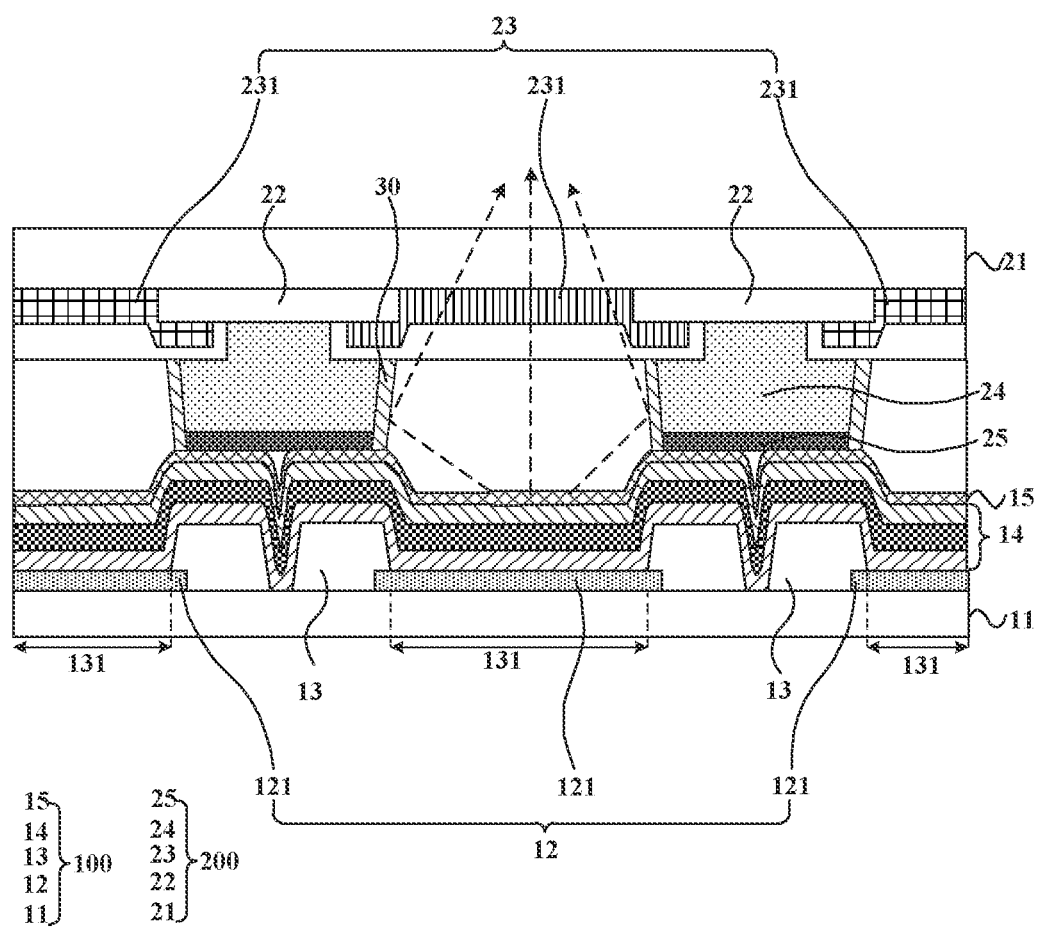
FIG. 3 shows a cross-sectional view of another OLED panel according to embodiments of the present disclosure.

On the basis of the above solution, FIG. 3 shows a cross-sectional view of another OLED panel according to embodiments of the present disclosure. As shown in FIG. 3, the OLED panel further includes a reflective layer 30, and the reflective layer 30 is disposed on one sidewall of the wall-shaped elastic conductor 24.

FIG. 3 exemplarily illustrates that the reflective layer 30 is disposed on the sidewall of the wall-shaped elastic conductor 24. Since the reflective layer 30 is disposed on the sidewall of the wall-shaped elastic conductor 24, the light emitted from each sub-pixel is limited in the closed space of the pixel, most of the light is directly emitted upward, part of the light with large angle reaches the reflective layer 30 on the sidewall of the wall-shaped elastic conductor 24 and is emitted after one or more reflections. Compared with the case of using an opaque wall-shaped elastic conductor 24, the light absorbed by the sidewall of the pixel definition layer in this embodiment is negligible, and the loss of light in the sub-pixel is relatively small. That is, almost all the light emitted from the light-emitting element of each sub-pixel is reflected, and the light-emitting efficiency of the OLED panel is improved.

Figure 4:
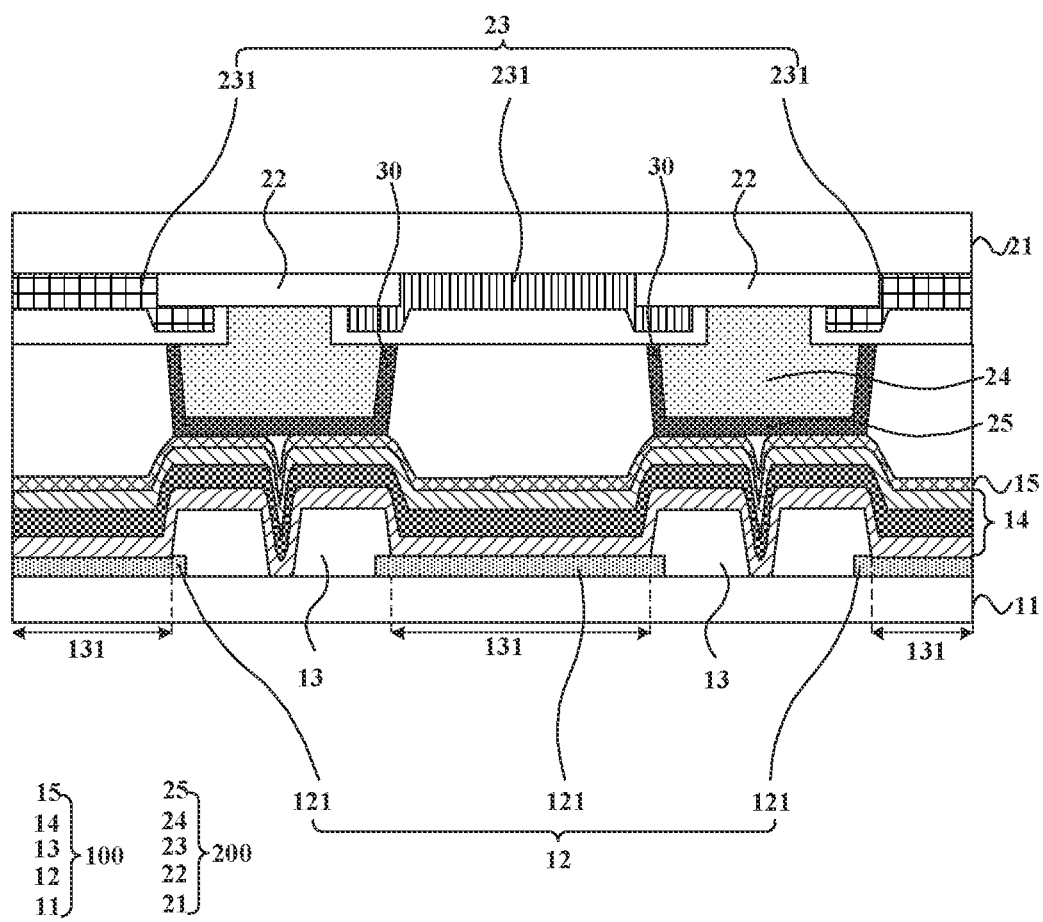
FIG. 4 shows a cross-sectional view of another OLED panel according to embodiments of the present disclosure.

Further, FIG. 4 illustrates a sectional view of another OLEDOLED panel according to embodiments of the present disclosure, where the metal cap 25 extends to the sidewall of the wall-shaped elastic conductor 24 to form the reflective layer 30.

The reflective layer 30 is formed by extension of the metal cap 25 to the wall-shaped elastic conductor 24, so that on one hand, the metal cap 25 and the reflective layer 30 can be formed in one process, thereby avoiding the use of a plurality of masks to prepare the metal cap 25 and the reflective layer 30, and reducing the complexity of the manufacturing process. On the other hand, due to the reflective layer 30, the wall-shaped elastic conductor 24 itself does not need to absorb light leaking at a large angle, so more choices are provided for the material of the wall-shaped elastic conductor 24 and the conductive particles doped in material mixed, and the wall-shaped elastic conductor doped with conductive particles may be transparent or opaque.

Figure 5:
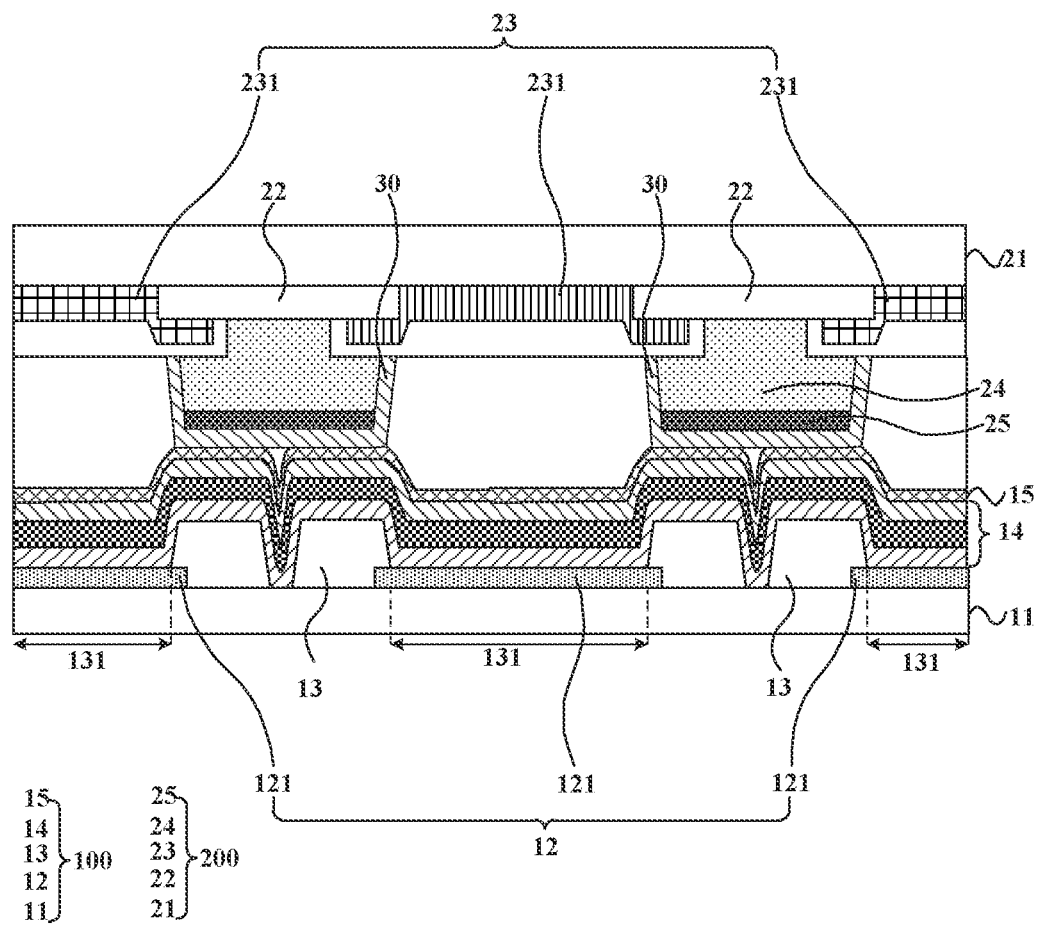
FIG. 5 shows a cross-sectional view of another OLED panel according to embodiments of the present disclosure.
Figure 6:
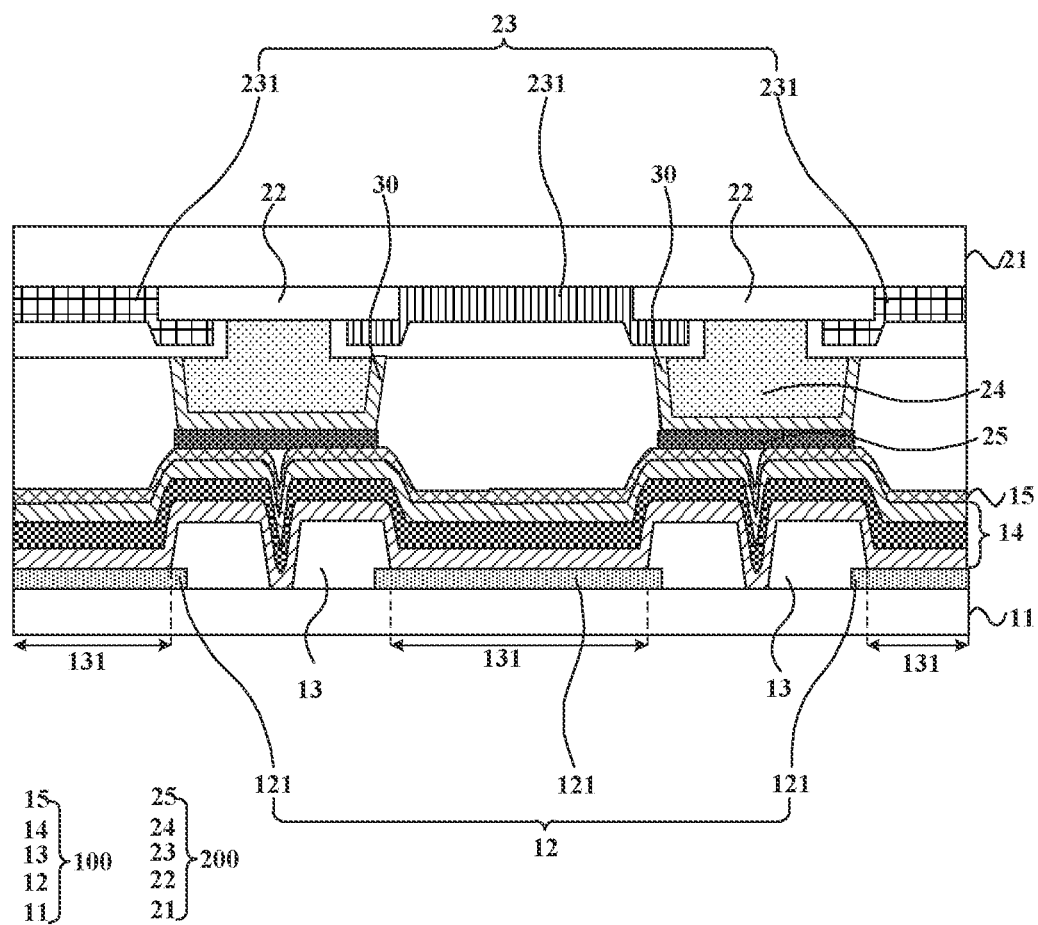
FIG. 6 shows a cross-structural view of another OLED panel according to embodiments of the present disclosure.

In one embodiment, as shown in FIGS. 5 and 6, the reflective layer 30 is disposed on one side of the metal cap 25 facing towards or facing away from the light-emitting substrate 100. FIG. 5 exemplarily illustrates that the reflective layer 30 is disposed on the side of the metal cap 25 facing towards the light-emitting substrate 100, and FIG. 6 exemplarily illustrates that the reflective layer 30 is disposed on the side of the metal cap 25 facing away from the light-emitting substrate 100.

In one embodiment, the working function difference between the reflective layer 30 and the metal cap 25 is less than 0.5 V.

Referring to FIGS. 5 and 6, the reflective layer may be disposed on the side of the metal cap facing towards the light-emitting substrate, or may be disposed on the side of the metal cap facing away from the light-emitting substrate. The working function difference between the reflective layer 30 and the metal cap 25 is set to be less than 0.5 V, so that it is possible to effectively prevent the metal cap 25 and the reflective layer 30 from having relatively large contact resistance due to the material difference therebetween.

In one embodiment, the conductive layer 22 includes chromium, chromium oxide or indium tin oxide.

The conductive layer 22 is disposed on the side of the wall-shaped elastic conductor 24 facing towards the second substrate 21, the conductive structure 22 is located between adjacent sub-pixel color filters 231, and the wall-shaped elastic conductor 24 is electrically connected to the conductive layer 22 through a gap between adjacent color filter of sub-pixels 231. The material selected for the conductive layer 22 includes chromium, chromium oxide or indium tin oxide, which can ensure that the conductive layer 22 has relatively low reflectivity, prevent the visible reflection of ambient light, and improve the display effect of the display panel.

It is to be noted that the conductive layer 22 may also be another conductive material with low reflectivity. The material of the conductive layer 22 is not specifically limited in the embodiments of the present disclosure.

Figure 7:
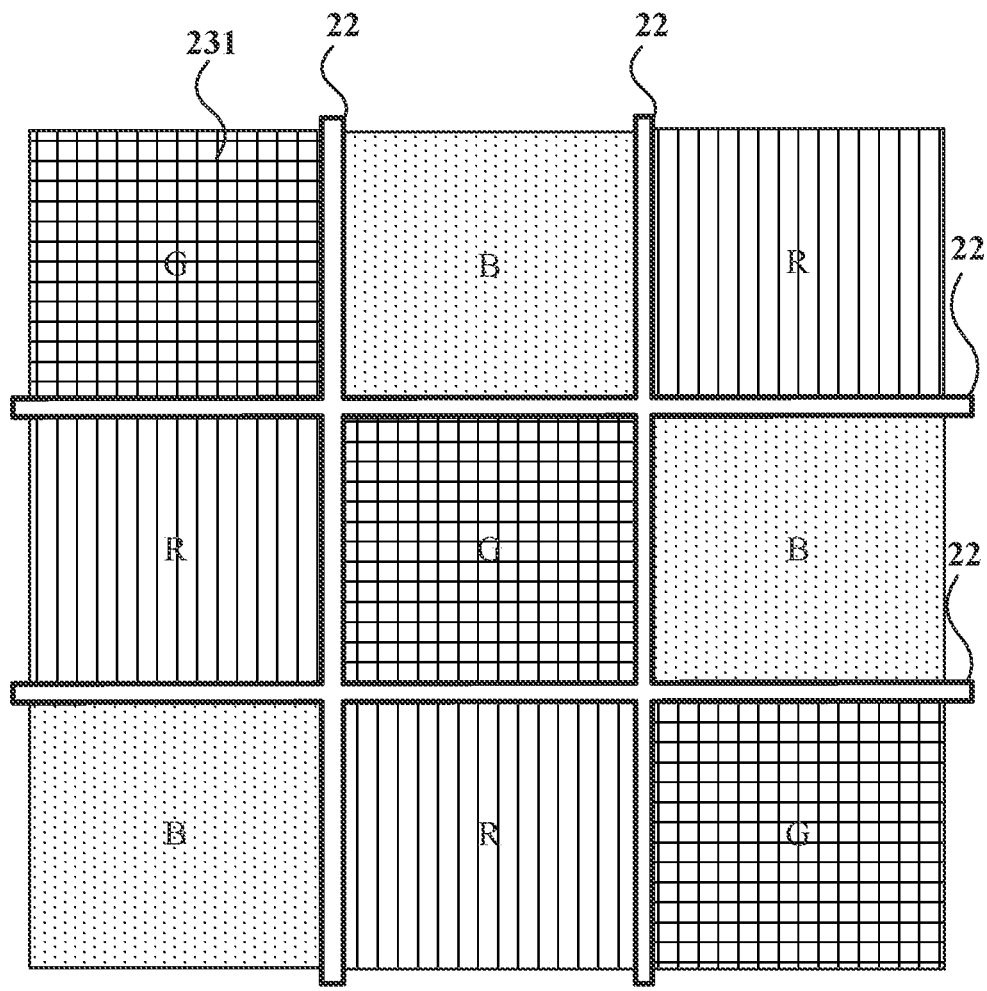
FIG. 7 shows a plane view of another OLED panel according to embodiments of the present disclosure.

In one embodiment, the conductive layer 22 is in a grid shape; or the conductive layer 22 includes a plurality of parallel conductive strips 221. FIG. 7 exemplarily illustrates that the conductive layer 22 is in a grid shape, and FIG. 8 exemplarily illustrates that the conductive structure 22 includes a plurality of parallel conductive strips 221.

A plurality of sub-pixels are defined in the OLEDOLED panel by a plurality of scanning lines and a plurality of data lines, the conductive layer 22 is disposed on the scanning line and the data line between adjacent sub-pixels, and the conductive layer 22 is in a grid shape. In this way, the conductive layer 22 can block the scanning line and the data line between adjacent sub-pixels, avoiding light leakage between two adjacent sub-pixels, and improving the display effect of the display panel.

Figure 8:
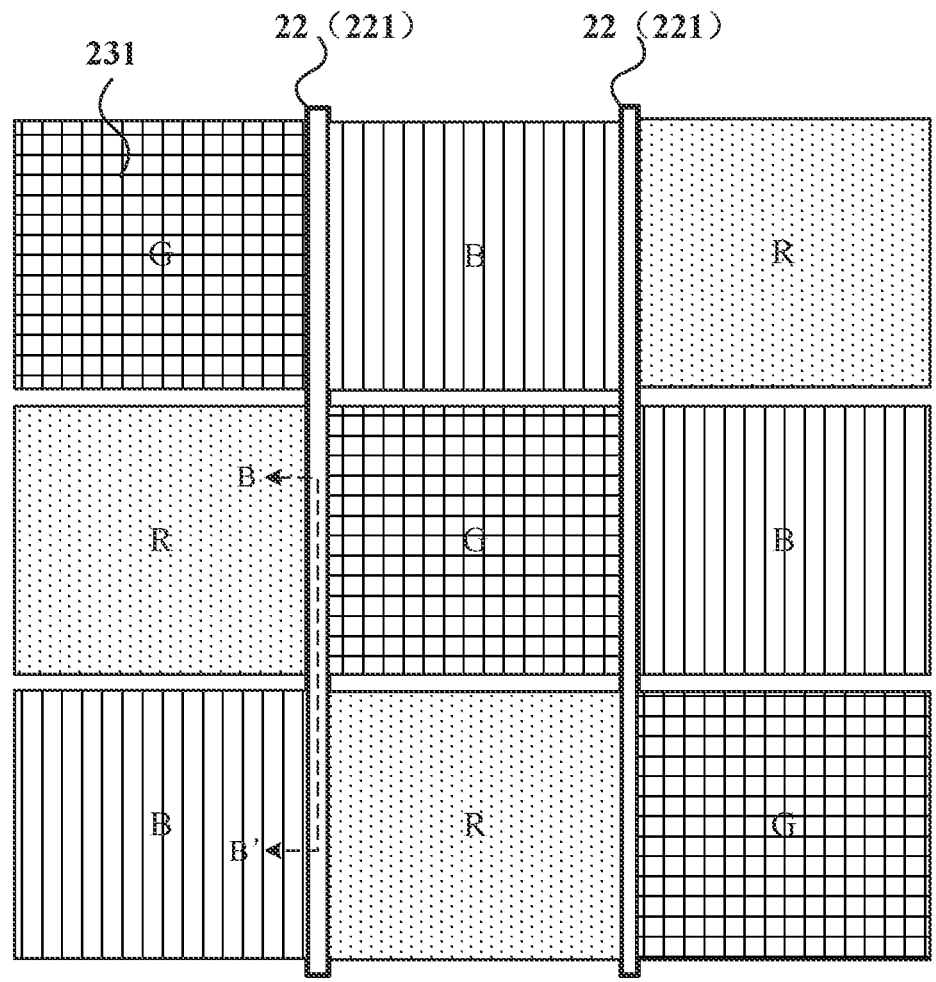
FIG. 8 shows a plane view of another OLED panel according to embodiments of the present disclosure.

Further, the conductive layer 22 is configured to include a plurality of parallel conductive strips 221. For example, the conductive layer 22 may be a plurality of conductive strips 221 parallel to the data lines of the display panel or a plurality of conductive strips 221 parallel to the scanning lines of the display panel. As shown in FIG. 8, FIG. 8 exemplarily illustrates that the conductive layer 22 is a plurality of parallel conductive strips 221. Through an increase in the thickness of the conductive strip, the material cost can be saved on the premise of ensuring the conductivity requirement of the conductive layer 22, and the preparation process is simple.

Figure 9:
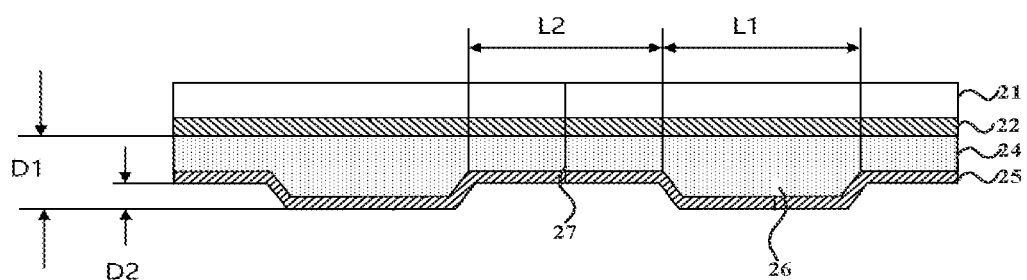
FIG. 9 shows a cross-sectional view of the OLED panel illustrated in FIG. 8 taken along a cross section B-B'.

Another embodiment is illustrated in FIG. 9, which shows a cross-sectional view of the OLED panel illustrated in FIG. 8 along B-B' cross-section. As shown in FIG. 9, the plurality of sub-pixel color filters 231 is arranged in an array, and in a direction parallel to an array row and/or in a direction parallel to an array column, the wall-shaped elastic conductor 24 includes a protrusion portion 27 and a recess portion 26 which are spaced apart.

As shown in FIG. 9, the wall-shaped elastic conductor 24 includes a protrusion portion 27 and a recess portion 26. When the light-emitting substrate 100 and the color filter substrate 200 in the OLED panel are bonded, lateral circulation of the internal airflow between the light-emitting substrate 100 and the color filter substrate 200 can be achieved. Furthermore, it is ensured that the wall-shaped elastic conductor 24 at each position can be in close contact with the second electrode layer 15 through the metal cap 25, avoiding a gap between part of the second electrode layer 15 at the region of the pixel definition layer 13 and the color filter substrate 200 due to the resonant cavity structures of different sub-pixels the related art.

The color filter substrate further includes a planarization layer, and the planarization layer is disposed on the surface of the color filter layer facing towards the light-emitting substrate. First, a wall-shaped elastic conductor is formed in a manner of linear coating or spin coating at a place where the conductive layer is exposed between adjacent sub-pixel color filters, and includes a protrusion portion 27 and a recess portion 26, and then a planarization layer is formed in a manner of coating. Since the formed wall-shaped elastic conductor 24 includes the protrusion portion and the recess portion, the wall-shaped elastic conductors formed on different pixel definition layers have different heights. The planarization layer is formed on the wall-shaped elastic conductor in the manner of coating, and the planarization layer in a liquid state before curing can flow laterally between adjacent sub-pixels through the protrusion portion and the recess portion, thus achieving the purpose of planarization of the uneven surface of the entire wall-shaped elastic conductor, and ensuring the close contact of the film layers in each region when the light-emitting substrate 100 and the color filter substrate 200 are mechanically press-fitted.

In one embodiment, still referring to FIG. 9, D1 represents a thickness of the recess portion and D2 represents a thickness of the protrusion portion. In a direction in which the recess portion and the protrusion portion are spaced apart, L1 represents a length of the protrusion portion and L2 represents a length of the recess portion, where $0.3 \leq D2/D1 \leq 0.7$, and $1 \leq L2/L1 \leq 10$.

When the height difference between the recess portion 26 and the protrusion portion 27 of the wall-shaped elastic conductor 24 is set to be too large, it is easy to cause large-angle light in the current pixel to pass through the gap and enter the cavity of the adjacent sub-pixel, thus causing light crosstalk and color mixing. However, when the height difference between the recess portion 26 and the protrusion portion 27 of the wall-shaped elastic conductor 24 is set to be too small, the lateral circulation of the airflow inside the wall-shaped elastic conductor 24 will be affected and the obstruction of the lateral circulation of the airflow will be increased. Considering the difficulty in manufacturing process, the mechanical pressure during encapsulation of the light-emitting substrate and the color filter substrate, and the elasticity characteristic of the wall-shaped elastic conductor, the thickness D1 of the recess portion and the thickness D2 of the protrusion portion may be set to satisfy $0.3 \leq D2/D1 \leq 0.7$, and the length L1 of the protrusion portion and the length L2 of the recess portion may be set to satisfy $1 \leq L2/L1 \leq 10$.

Figure 10:
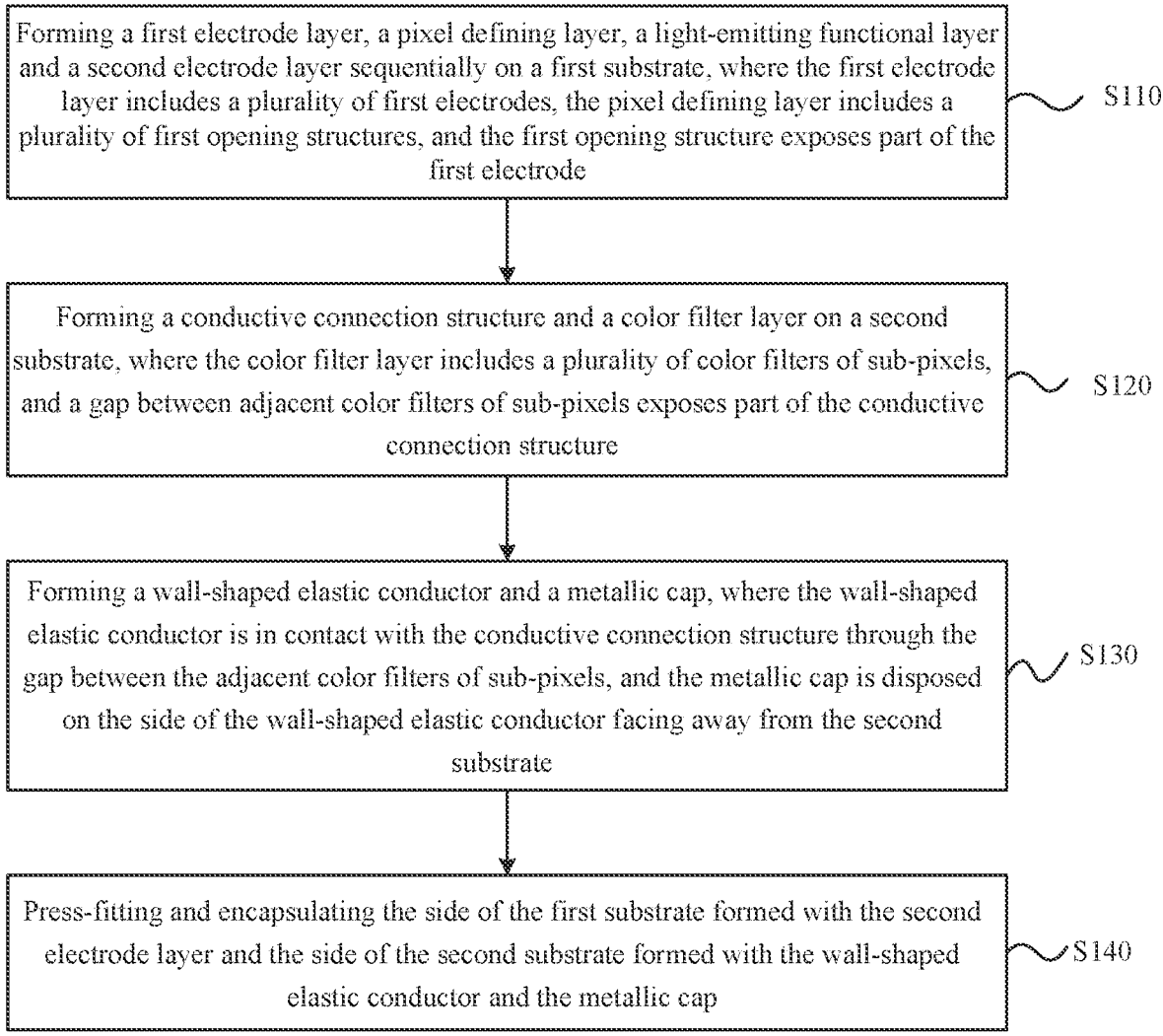
FIG. 10 is a flowchart illustrating a manufacturing method of an OLED panel according to embodiments of the present disclosure.

On the basis of the above embodiment, FIG. 10 is a flowchart illustrating a manufacturing method of an OLED panel according to embodiments of the present disclosure. The method includes steps described below.

In S110, a first electrode layer, a pixel definition layer, a light-emitting layer and a second electrode layer are successively formed on a first substrate, the first electrode layer includes a plurality of first electrodes, the pixel definition layer includes a plurality of first opening structures to expose part of the first electrodes.

In S120, a conductive layer and a color filter layer are formed on a second substrate, the color filter layer includes a plurality of sub-pixel color filters, and a gap between two adjacent sub-pixel color filters that a portion of the conductive layer is exposed through the gap.

In S130, a wall-shaped elastic conductor and a metal cap are formed, where the wall-shaped elastic conductor is in contact with the conductive layer through the gap between the two adjacent sub-pixel color filters, and the metal cap is disposed on the top of the wall-shaped elastic conductor facing away from the second substrate.

In S140, the surface of the first substrate formed with the second electrode layer and the surface of the second substrate formed with the wall-shaped elastic conductor and the metal cap are press-fitted and encapsulated.

The manufacturing process of the light-emitting substrate includes the following step: the first electrode layer, the pixel definition layer, the light-emitting layer and the second electrode layer are successively formed on the first substrate, the first electrode layer includes the plurality of first electrodes, the pixel definition layer includes the plurality of first opening structures to expose part of the first electrodes.

The manufacturing process of the color filter substrate includes the following steps: first, a layer of conductive layer is deposited on the second substrate, where the material of the conductive layer includes chromium, chromium oxide, indium tin oxide, and the like, and then the light sensitive resin doped with red (R), green (G) and blue (B) dyes is used on the conductive layer to form pixel color filter arrays of three colors, i.e., R, G and B, respectively through three processes. Since the thickness of each pixel color filter layer is different, a planarization layer is formed in a manner of coating. The planarization film layer between adjacent sub-pixel color filters is provided with a hole to expose the conductive layer, and then a linear coating or spin coating manner is adopted at the place where the conductive layer is exposed between the adjacent sub-pixel color filters, for example, a wall-shaped elastic conductor with a thickness of not less than 1 micron is coated. After the coating process is completed, thermal bake or UV curing process is performed in an oven at no lower than 110° C., or an organic film hardening process with equal emphasis on thermal bake and UV is performed. A metal film layer with high conductivity is plated on the hardened and formed wall-shaped elastic conductor in a manner of sputtering or thermal evaporation. A relatively stable high-conductivity material, such as gold, silver, copper or alloy, may be selected, or the same metal material as the second electrode layer may be directly used to perform photolithography on the metal film layer in a manner of photolithography to form a metal cap.

After the manufacturing processes of the light-emitting substrate and color filter substrate are respectively completed, the surface of the first substrate formed with the second electrode layer and the surface of the second substrate formed with the wall-shaped elastic conductor and the metal cap are press-fitted and encapsulated.

According to the manufacturing method of the OLED panel provided in the embodiments of the present disclosure, the first electrode layer, the pixel definition layer, the light-emitting layer and the second electrode layer are formed on the light-emitting substrate side, the conductive layer, the color filter layer, the wall-shaped elastic conductor and the metal cap are formed on the color filter substrate side, and then the side of the light-emitting substrate formed with the second electrode layer and the side of the color filter substrate formed with the wall-shaped elastic conductor and the metal cap are mechanically press-fitted and encapsulated. The second electrode layer on the light-emitting substrate is electrically connected to the conductive structure sequentially through the metal cap and the wall-shaped elastic conductor. Therefore, on one hand, the problem that the resistance of the second electrode layer is too large due to the thinner second electrode layer can be solved. On the other hand, if the second electrode layer is broken at the position of the pixel definition layer, since the second electrode layer can also be electrically connected to the conductive layer sequentially through the metal cap and the wall-shaped elastic conductor, the problem that light-emitting efficiency and light-emitting uniformity are affected due to an increase in the voltage drop at the broken position of the second electrode layer can also be avoided. In addition, since the wall-shaped elastic conductor has resilience, the wall-shaped elastic conductor at each position can also be in close contact with the second electrode layer through the metal cap, avoiding a gap between part of the second electrode layer at the region of the pixel definition layer and the color filter substrate due to the resonant cavity structures of different sub-pixels in the related art. Further, the metal cap is deposited and grown on the wall-shaped elastic conductor, so the metal cap can be closely connected to the wall-shaped elastic conductor to obtain reliable electrical connection at the atomic or molecular level. Since the second electrode layer is generally made of a metal material or a metal oxide material, the wall-shaped elastic conductor being connected to the second electrode layer through the metal cap can reduce the problem of relatively large contact resistance caused by different chemical and physical properties of the surfaces of the wall-shaped elastic conductor and the second electrode layer, improving light-emitting efficiency and light-emitting uniformity of the OLED panel.

Figure 11:
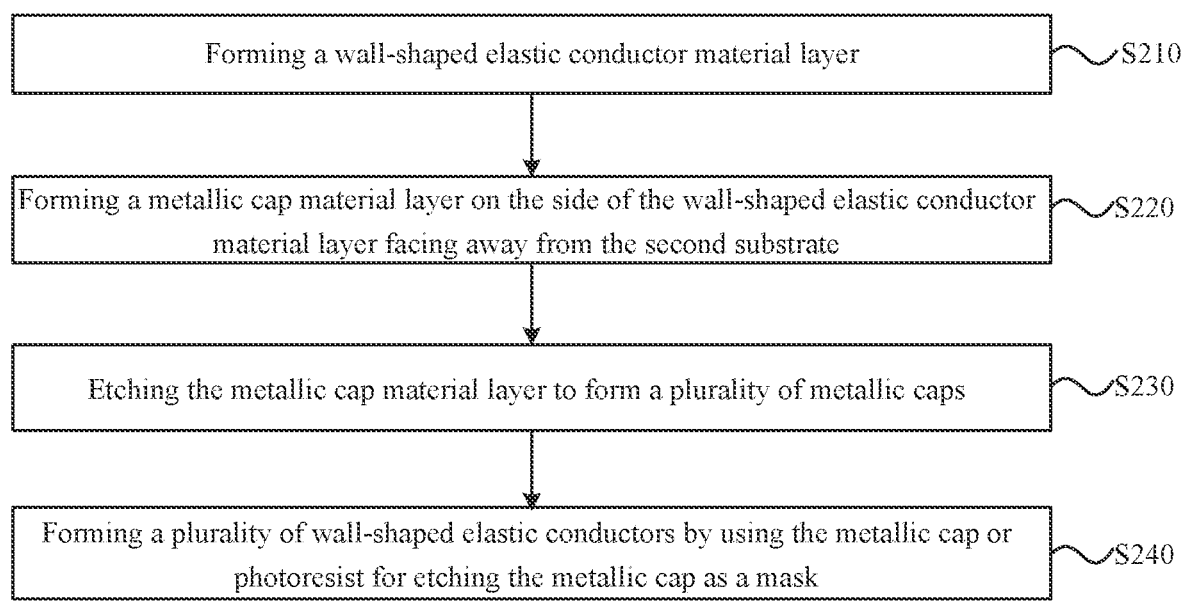
FIG. 11 is a flowchart illustrating another manufacturing method of an OLED panel according to embodiments of the present disclosure.

In one embodiment, on the basis of the above embodiment, FIG. 11 is a flowchart illustrating another manufacturing method of an OLED panel according to embodiments of the present disclosure. The step of forming the wall-shaped elastic conductor and the metal cap includes steps described below.

In S210, a wall-shaped elastic conductor material layer is formed.

In S220, a metal cap material layer is formed on the side of the wall-shaped elastic conductor material layer facing away from the second substrate.

In S230, the metal cap material layer is etched to form a plurality of metal caps.

In S240, a plurality of wall-shaped elastic conductors are formed by using the metal cap or photoresist for etching the metal cap as a mask.

It is to be noted that the plurality of wall-shaped elastic conductors are formed by using the photoresist for etching the metal cap as a mask, so that the metal cap and the wall-shaped elastic conductor can be formed in one process, thus avoiding the use of a plurality of masks to prepare and form the metal caps and the wall-shaped elastic conductors, and reducing the complexity of the preparation process.

The above detailed descriptions of the embodiments of the present invention set forth preferred modes contemplated by the inventors for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An organic light-emitting display (OLED) panel, comprising:
   a light-emitting substrate,
   a wall-shaped elastic conductor including a metal cap on its top, and
   a color filter substrate; wherein
   the light-emitting substrate comprises:
      a first substrate,
      a first electrode layer including a matrix of first electrodes,
      a pixel definition layer,
      a light-emitting layer, and
      a second electrode layer, wherein
   the pixel definition layer comprises a plurality of opening structures exposing a portion of the first electrodes,
   the light-emitting layer is on one side of the first electrode layer facing away from the first substrate, and
   the second electrode layer is on one side of the light-emitting layer facing away from the first substrate;
   the color filter substrate comprises:
      a second substrate,
      a color filter layer formed by a plurality of sub-pixel color filters, and
      a conductive layer; wherein
   a continuous groove structure in a grid shape is configured on the pixel definition layer between adjacent sub-pixels,
   the second electrode is partitioned into a plurality of metal pieces by the groove structure,
   the wall-shaped elastic conductor completely covers the groove structure in a direction perpendicular to the first substrate, and
   the plurality of metal pieces of the second electrode are electrically reconnected by the metal cap disposed on the wall-shaped elastic conductor,
   the wall-shaped elastic conductor is sandwiched by the light-emitting substrate and the color filter substrate in a manner that a vertical projection of the wall-shaped elastic conductor on the light-emitting substrate completely covers a vertical projection of the pixel definition layer on the light-emitting substrate, and the metal cap is in contact with either the second electrode layer in the light-emitting substrate or the conductive layer in the color filter substrate.

2. The OLED panel according to claim 1, wherein the wall-shaped elastic conductor comprises an organic and conductive base material or an organic base material mixed with conductive particles.

3. The OLED panel according to claim 2, wherein the organic and conductive base material comprises a poly ethylene material, a polyvinyl chloride material, a polystyrene material, a polypropylene material or a resin material.

4. The OLED panel according to claim 2, wherein the conductive particles mixed in the base material comprises at least one of the following materials: a carbon nanoparticle, a carbon nanotube, a graphene particle, a silicon nanoparticle and a metal nanoparticle.

5. The OLED panel according to claim 4, wherein a volume ratio of the carbon nanoparticle or the carbon nanotube in the wall-shaped elastic conductor ranges from 10% to 30%.

6. The OLED panel according to claim 4, wherein a length of the carbon nanotube is less than 2 um and a diameter of the carbon nanotube is less than 50 nm.

7. The OLED panel according to claim 1, wherein the wall-shaped elastic conductor comprises a conducting macromolecule polymer.

8. The OLED panel according to claim 7, wherein the wall-shaped elastic conductor comprises conducting at least one of the followings: macromolecule polyaniline, polyacetylene and polybutadiene.

9. The OLED panel according to claim 7, wherein the wall-shaped elastic conductor further comprises at least one of the followings: carbon nanoparticle, carbon nanotube, graphene particle, silicon nanoparticle and metal nanoparticle.

10. The OLED panel according to claim 1, further comprising a reflective layer, wherein the reflective layer is disposed on a sidewall of the wall-shaped elastic conductor.

11. The OLED panel according to claim 10, wherein the metal cap extends to the sidewall of the wall-shaped elastic conductor to form the reflective layer.

12. The OLED panel according to claim 10, wherein a working function difference between the reflective layer and the metal cap is less than 0.5 V.

13. The OLED panel according to claim 1, wherein the conductive layer is in a grid shape; or the conductive layer comprises a plurality of parallel conductive strips.

* * * * *